(12) United States Patent
Mori

(10) Patent No.: US 7,115,975 B2
(45) Date of Patent: Oct. 3, 2006

(54) SEMICONDUCTOR DEVICE, PROCESS OF PRODUCING SEMICONDUCTOR DEVICE, AND INK JET RECORDING HEAD

(75) Inventor: Toshihiro Mori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 16 days.

(21) Appl. No.: 10/928,162

(22) Filed: Aug. 30, 2004

(65) Prior Publication Data

US 2005/0093128 A1 May 5, 2005

(30) Foreign Application Priority Data

Sep. 5, 2003 (JP) ............... 2003-313735
Aug. 6, 2004 (JP) ............... 2004-230803

(51) Int. Cl.
*H01L 23/495* (2006.01)
(52) U.S. Cl. .................... 257/668; 257/669
(58) Field of Classification Search ........... 257/666, 257/668, 672, 674, 669, 775, 773
See application file for complete search history.

(56) References Cited

U.S. PATENT DOCUMENTS

| 4,109,096 A * | 8/1978 | Dehaine ............... 174/253 |
| 4,331,740 A * | 5/1982 | Burns ................. 428/572 |
| 4,987,474 A * | 1/1991 | Yasuhara et al. ........ 257/666 |
| 5,081,474 A | 1/1992 | Shibata et al. |
| 5,250,839 A * | 10/1993 | Katoh et al. ........... 257/666 |
| 5,317,188 A * | 5/1994 | Kondou ................ 257/668 |
| 5,491,505 A | 2/1996 | Suzuki et al. |
| 6,037,662 A * | 3/2000 | Yoon et al. ............ 257/735 |
| 6,056,391 A | 5/2000 | Kasamoto et al. |
| 6,180,018 B1 | 1/2001 | Miyagawa et al. |
| 6,315,853 B1 | 11/2001 | Kubota et al. |
| 6,609,782 B1 | 8/2003 | Mori |
| 6,609,783 B1 | 8/2003 | Koyama et al. |
| 6,629,755 B1 | 10/2003 | Saito et al. |
| 6,847,101 B1 * | 1/2005 | Fjelstad et al. .......... 257/668 |
| 2002/0182841 A1 * | 12/2002 | DiStefano et al. ........ 438/611 |
| 2005/0087890 A1 * | 4/2005 | Minamio et al. ......... 257/787 |

FOREIGN PATENT DOCUMENTS

JP          2003-7765          1/2003

* cited by examiner

*Primary Examiner*—S. V. Clark
(74) *Attorney, Agent, or Firm*—Fitzpatrick, Cella, Harper & Scinto

(57) ABSTRACT

When bonding inner leads of a flexible film wiring board to electrode pads of a semiconductor element substrate, by absorbing a stress generated due to a difference in thermal expansion coefficient between the flexible film wiring board and the semiconductor element substrate during cooling after heat-bonding, by a through-hole or recessed groove portion formed in the inner leads, it is possible to prevent peeling off of a bonding portion and improve the reliability.

7 Claims, 7 Drawing Sheets

SEMICONDUCTOR DEVICE, PROCESS OF PRODUCING SEMICONDUCTOR DEVICE, AND INK JET RECORDING HEAD

BACKGROUND OF THE INVENTION

1. Field of the Invention

The present invention relates to a semiconductor device in which a flexible film wiring board is connected to a semiconductor element substrate, a process of producing the semiconductor device, and an ink jet recording head using the semiconductor device.

2. Related Background Art

A semiconductor device has been hitherto known which uses a flexible film wiring board such as a TAB (Tape Automated Bonding) or FPC (Flexible Printed Circuit) in order to realize a high integration as disclosed in Japanese Patent Application Laid-Open No. 2003-7765.

FIGS. 7A and 7B are views illustrating a semiconductor device using such a flexible film wiring board. FIG. 7A is a plan view of a main part and FIG. 7B is a sectional view taken along line 7B—7B in FIG. 7A.

In FIGS. 7A and 7B, reference numeral 101 denotes a semiconductor element substrate made of silicon or the like and 102 denotes a flexible film wiring board on which an inner lead 105 serving as an electric wiring pattern in the board is formed. A rectangular device hole 103 for fixing the semiconductor element substrate 101 is formed on the flexible film wiring board 102. Moreover, a flat base film 104 made of an insulating resin such as polyimide is formed on the upper surface of the flexible film wiring board 102. The inner lead 105 is obtained by adhering a metallic foil made of a conductive material such as a copper foil to the lower surface of the base film 104 and patterning the inner lead 105 in a desired shape through the photolithography technique. The lower surface of the patterned inner lead 105 is plated with gold, silver, or solder and moreover, a region of the lower surface from which a metallic face will not be exposed is covered with a resist layer 108 and the like. At this time, a wiring electrode (not illustrated) and an electrode pad (not illustrated) to be bonded to the body are also formed.

Moreover, the inner lead 105 is formed by extending from the flexible film wiring board 102 into the opening of the device hole 103. A plurality of electrode pads 106 are formed on the surface of the semiconductor element substrate 101. The electrode pads 106 are respectively electrically bonded to the front end portion of the inner lead 105 extending into the opening of the device hole 103 through a stud bump 107.

The stud bump 107, which is a metallic protrusion, is previously set on the electrode pad 106, and the inner lead 105 to be bonded is located immediately on the stud bump 107 and the inner lead 105 is bonded to the stud bump 107 by using a bonding tool from above the inner lead 105. Thereby, the inner lead 105 is electrically bonded to the electrode pad 106.

At this time, the semiconductor element substrate 1 is vacuum-attracted to and fixed on a bonding stage so that a preferable bonding state is obtained. This bonding method is normally referred to as ILB (Inner Lead Bonding).

The ILB method is roughly divided into two types. One of them is a gang bonding method for simultaneously bonding all inner leads 105 to stud bumps 107 by a bonding tool for each semiconductor substrate 101. The other of them is a single point bonding method for independently and selectively bonding the inner leads 105 to the stud bumps 107 one by one.

However, in both the gang bonding method and single point bonding method, the inner leads 105 are bonded to the stud bumps 107 while they are heated at a high temperature. To bond the inner lead 105 whose surface is plated with gold to the stud bump 107 of a gold pole by the gang bonding method, it is necessary to heat a bonding tool up to about 500° C. In the case of the single point bonding method, it is necessary to effect heating up to about 200° C.

The thermal expansion coefficients of the base film 104 mainly made of an insulating organic resin and the inner lead 105 mainly made of copper (Cu) are far larger than the thermal expansion coefficient of the semiconductor element substrate 101 made of silicon or the like. Therefore, a displacement occurs in the relative positional relation between the stud bump 107 and inner lead 105 on the semiconductor element substrate 1 in accordance with the thermal expansion of the flexible film wiring board 102.

Therefore, Japanese Patent Application Laid-Open No. 2003-007765 discloses that the array pitch of the inner leads 105 is decided by previously considering the elongation of the base film 104. Moreover, it discloses that a relative shift value of the inner lead 105 from the stud bump 107 is absorbed by making the width of the bonding portion between the inner lead 105 and the stud bump 107 larger than the relative displacement value of the inner lead 105 from the stud bump 107.

However, the number of cases in which plural types of semiconductor element substrates are mounted on one flexible film wiring board has been increased in recent years. For example, there are printing machines using the ink jet system such as shown in FIG. 8 (printer, facsimile machine, copying machine, and multifunction machine thereof). FIG. 9 shows a semiconductor device constituted by mounting semiconductor element substrates on a flexible film wiring board, as mentioned above. In FIG. 9, two device holes 113a and 113b are formed in one flexible film wiring board 102. A semiconductor element substrate (heater board 101a) for a black ink cartridge is mounted in the device hole 113a and a semiconductor element substrate (heater board 101b) for a color ink cartridge is mounted in the device hole 113b. Nozzle members 116a and 116b each having a plurality of discharge openings for discharging an ink are formed on the upper surfaces of the heater boards 101a and 101b. Moreover, the heater boards 101a and 101b are fixed and disposed on a support member 110 and the flexible film wiring board 102 is set by being precisely aligned with the heater boards 101a and 101b. Incidentally, the same reference numerals are employed in FIG. 9 as are employed in FIG. 7 for equivalent elements and their description is omitted.

In FIG. 9, the landing accuracy of ink droplets discharged from the heater boards 101a and 101b are determined by positions of the heater boards 101a and 101b. Therefore, the heater board 101a for black ink cartridge and the heater board 101b for color ink cartridge must be fixed while they are mutually accurately aligned on the support member 110.

However, as described for Japanese Patent Application Laid-Open No. 2003-7765, when heating the inner lead 105 and electrode pad 106 and bonding them to each other and cooling and fixing them on the support member 110, a displacement occurs in the relative position between the flexible film wiring board 2 and the heater boards 101a and 101b. That is, the positions of the flexible film wiring board 2 and the heater boards 101a and 101b are offset with respect to each other due to the difference in thermal expansion coefficient of the flexible film wiring board 2 and the heater boards 101a and 101b during heating and cooling.

Therefore, it has been proposed that the heater boards 101a and 101b are previously accurately positioned on the support member 110 and heated to bond the inner lead 105 and the electrode pad 106 to each other, followed by cooling. In this case, the flexible film wiring board 2 and the heater boards 101a and 101b are heated while they are strongly fixed and are bonded while they are expanded. Thereafter, they are cooled down to ordinary temperature. However, because the inner lead 105 and electrode pad 106 are completely bonded while they are heated, a stress is generated due to the difference in thermal expansion coefficient between the heater boards 101a and 101b and the flexible film wiring board 102 during the cooling step. The stress generated at this time is entirely applied to a bonding portion through the inner lead 105. When the stress exceeds the bonding strength between the electrode pad 106 and the stud bump 107 or the bonding strength between the stud bump 107 and the inner lead 105, peeling off is caused at the boding portion. That is, the reliability of the bonding portion between the inner lead 105 and the electrode pad 106 is deteriorated and in some cases, the portion may be cut or broken. Particularly, in the case where a positional displacement is to be prevented by increasing the width of the inner lead 105 as previously mentioned, the rigidity of the inner lead 105 itself is increased, so that a defect due to the peeling off of the bonding portion will noticeably develop.

Incidentally, the stress generated due to thermal expansion of the flexible film wiring board 102 and heater boards 101a and 101b exists two-dimensionally in the direction of plane shown in FIG. 9.

However, a semiconductor device according to the ordinary TAB method is wound in most cases in a state in which it is mounted on the flexible film wiring board 102 after bonding of the semiconductor element substrate 101 and the flexible film wiring board 102. Therefore, because it is not necessary to fix the semiconductor element substrate 101 to a support member, the above problem does not occur. However, in the case of a semiconductor device for which a high positional accuracy is requested as is the case with an ink jet printing machine, it is necessary to previously fix the semiconductor element substrate 101 to the support member 110, so that the above-mentioned problem will occur.

SUMMARY OF THE INVENTION

The present invention has been accomplished in view of the above-mentioned problems, and it is an object of the present invention to provide a flexible film wiring board capable of preventing peeling off of a bonding portion between an electrode pad and a stud bump or between a stud bump and an inner lead even if an external stress due to a difference in thermal expansion coefficient is applied thereto and thus improving the reliability, a semiconductor device using the flexible film wiring board, and an ink jet recording head using the flexible film wiring board or semiconductor device.

To achieve the above object, according to a first aspect of the present invention, there is provided a semiconductor device comprising a support member, a flexible film wiring board fixed to the support member, having at least one device hole formed therein and having a plurality of inner leads provided therein and extended therefrom, and at least one semiconductor element substrate with a plurality of electrode pads fixed to the support member, housed in the device hole and mounted by bonding the plurality of extended inner leads to the plurality of electrode pads within the device hole, wherein the inner leads each have a small sectional-area region with a sectional area less than the other portion within a region between the portion of bonding of the inner leads to the electrode pads and the flexible film wiring board.

In the present invention, it is preferred that the small sectional-area region is constituted by at least one through-hole penetrating the inner lead or a recessed groove portion.

Further, it is preferred that the width of the inner lead in the small sectional-area region is less than the width of the inner lead in the bonding portion.

Moreover, it is preferred that the widthwise centerline of the small sectional-area region is offset with respect to the widthwise centerline of the inner lead in the bonding portion.

Further, it is preferred that the small sectional-area region has a cutout portion formed therein.

According to a second aspect of the present invention, there is provided an ink jet recording head using the semiconductor device.

According to a third aspect of the present invention, there is provided a process of producing a semiconductor device comprising the steps of:

preparing a flexible film wiring board having at least one device hole formed therein and having a plurality of inner leads provided therein and extended therefrom;

preparing at least one semiconductor element substrate for housing in the device hole having a plurality of electrode pads;

preparing a support member for fixing the flexible film wiring substrate and the semiconductor element substrate thereto;

positioning and disposing a front end portion of each of the extended inner leads of the flexible film wiring board and corresponding one of the electrode pads of the semiconductor element substrate within the device hole;

heating the flexible film wiring board and the semiconductor element substrate and bonding the inner leads and the electrode pads to each other, and adhering and fixing the semiconductor element substrate to the support member; and cooling the inner leads and the electrode pads in the bonded state and releasing a stress generated between the inner leads and the electrode pads by deforming the inner leads, wherein the inner leads each have a small sectional-area region with a sectional area less than the other portion within a region between the portion of bonding of the inner leads to the electrode pads and the flexible film wiring board.

The above and other objects of the present invention will become more apparent from the following description taken in conjunction with the accompanying drawings.

DESCRIPTION OF THE PREFERRED EMBODIMENTS

EXAMPLE 1

Figure 1A:
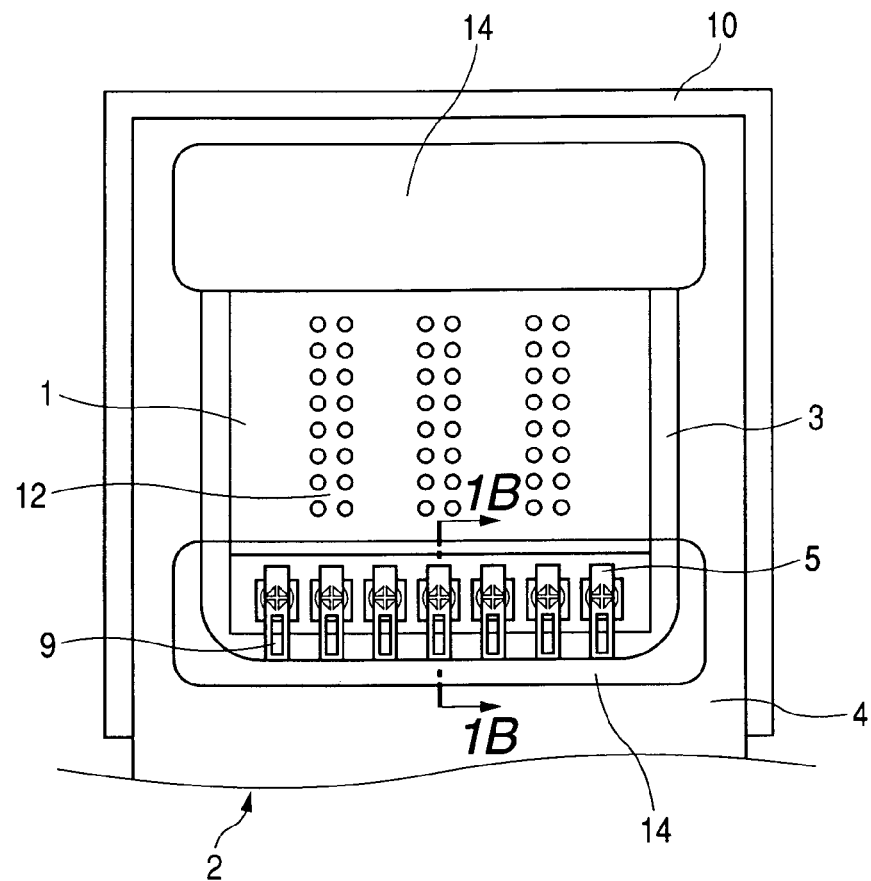
FIG. 1A is a plan view of a semiconductor device of Example 1 and FIG. 1B is a sectional view taken along line 1B—1B in FIG. 1A.
Figure 1B:
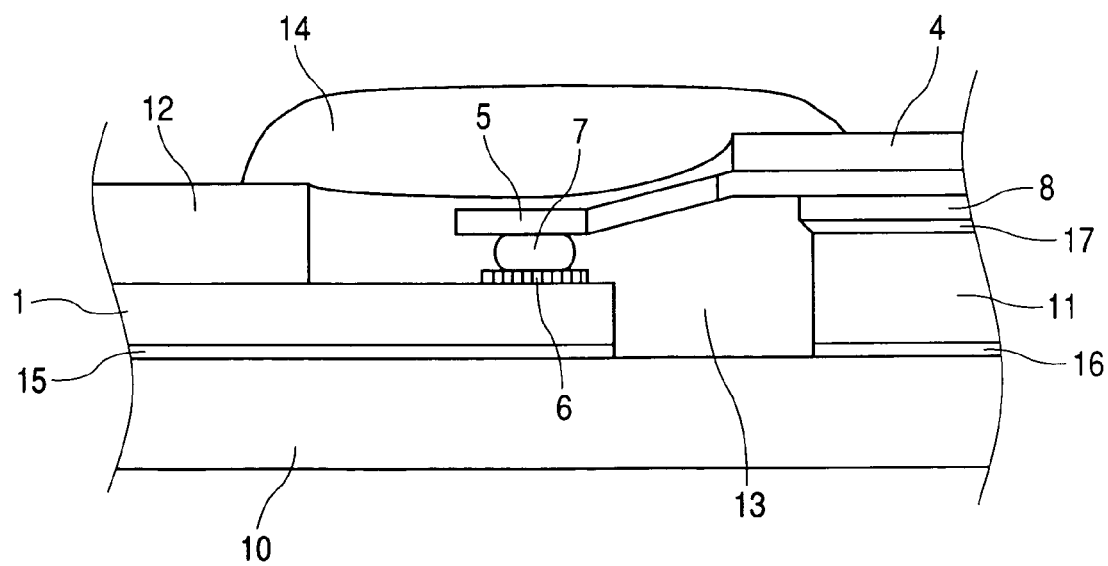

FIGS. 1A and 1B are views for illustrating a semiconductor device in which a flexible film wiring board of the present invention is used for a printing machine using an ink jet system. FIG. 1A is a plan view of a main part and FIG. 1B is a sectional view taken along line 1B—1B in FIG. 1A. Although the present example is described below with reference to a device having a single semiconductor element substrate (heater board) as a matter of convenience, it will be understood by those skilled in the art that the number of semiconductor element substrates (heater boards) may be more than 1.

In FIGS. 1A and 1B, reference numeral 1 denotes a semiconductor element substrate made of silicon or the like and 2 denotes a flexible film wiring board in which an inner lead 5 serving as an electric wiring pattern is formed. A rectangular device hole 3 for fixing and disposing the semiconductor element substrate 1 is formed in the flexible film wiring board 2. Moreover, a flat plate shaped base film 4 made of an insulating resin such as Upirex (trade name) or Capton (trade name) is formed on the upper surface of the flexible film wiring board 2. The inner lead 5 is obtained by adhering a metallic foil made of a conductive material such as a copper foil to the lower surface of the base film 4 and effecting patterning in a desired shape using the photolithography technique. The lower surface of the inner lead 5 after the patterning is plated with gold, tin, solder, or the like and a region in which a metallic surface will not be exposed is covered with a resist layer 8 or the like. In this case, a wiring electrode (not illustrated), electrode pads (not illustrated) for bonding to the body or the like are also formed.

Moreover, the inner lead 5 is formed so as to extend inwardly into the opening of the device hole 3 from the flexible film wiring board 2. A plurality of electrode pads 6 made of aluminum or the like are formed on the surface of the semiconductor element substrate 1. Moreover, a stud bump 7 formed of a ball bump of gold, solder, or the like is provided on each of the plurality of electrode pads 2. Gold is used for the stud bump 7 when higher reliability is required, while solder is used for the stud bump 7 when cost reduction is required. The electrode pads 6 are accurately positioned and electrically connected through the stud bumps 7 to the front end portions of the inner leads 5 extending inwardly into the opening of the device hole 3 in a one to one correspondence. Moreover, a slit-like through-hole 9 is formed in each of the inner leads 5 extending into the opening of the device hole 3.

The semiconductor element substrate 1 is adhered and fixed to a support member 10 with a first adhesive 15. Moreover, a support plate 11 is fixed to the support member 10 through a second adhesive 16, and the support plate 11 is fixed to the resist layer 8 of the flexible film wiring board 2 through a third adhesive 17.

A nozzle portion 12 for discharging an ink for ink jet recording is further formed on the surface of the semiconductor element substrate 1. A plurality of discharge openings are formed in the nozzle portion 12. Moreover, the device hole 3 is encapsulated by a first encapsulating resin 13 after the bonding of the electrode pads 6 and inner leads 5. Furthermore, the upper portion of the bonding portions of the electrode pads 6 and the inner leads is encapsulated with a second encapsulating resin 14.

The connecting steps between the semiconductor element substrate 1 and the flexible wiring board 2 shown in FIGS. 1A and 1B are described below in sequence.

First, the semiconductor element substrate 1 is adhered and fixed to the upper surface of the support member 10 with the first adhesive 15. The plurality of electrode pads 6 and the nozzle portion 12 having a plurality of lines of discharging openings formed therein are previously formed on the upper surface of the semiconductor element substrate 1.

Then, the flexible film wiring board 2 in which the inner leads 5 are formed is prepared. The device hole 3 in which the semiconductor element substrate 1 is to be mounted is formed in the flexible film wiring board 2. The upper surface of the flexible film wiring board 2 is covered with the base film 4, while the lower surface of the board 2 is covered with the resist layer 8. The lower surface of the resist layer 8 covering the flexible film wiring board 2 is bonded to the support plate 11 through the third adhesive 17. Moreover, the slit-shaped through-hole 9 is previously formed in each of the inner leads 5 formed so as to extending inwardly into the opening of the device hole 3.

Then, the stud bump 7 is formed on the electrode pad 6 formed on the upper surface of the semiconductor element substrate 1 and the flexible film wiring board 2 is then bonded to the semiconductor element substrate 1 while effecting alignment between the stud bump 7 and the corresponding front end portion of the inner lead 5. As the bonding method, either of the gang bonding method or the single point bonding method described above may be used. At this time, the lower surface of the support plate 11 is adhered to the support member 10 with the second adhesive 16.

In the bonding step, the stud bump 7 and the inner lead 5 are heated up to about 200° C. The thermal expansion coefficients of the base film 4 mainly made of an insulating organic resin such as Upirex or Capton and the inner lead 5 mainly made of copper are far larger than the thermal expansion coefficient of the semiconductor element substrate 1. Therefore, the position of the stud bump 7 will be greatly offset with respect to the position of the inner lead 5 during the heating. However, the positional displacement will not particularly pose any problem as long as desired stud bump 7 and inner lead 5 can be securely electrically connected to each other without leaking with adjacent stud bump 7 or inner lead 5. Moreover, the positional displacement can also be obviated by previously assuming a value of the positional displacement and setting the positions of the stud bump 7 and inner lead 5.

However, the stud bump 7 and the inner lead 5 as bonded at about 200° C. will then be cooled down to ordinary temperature. The stud bump 7 and inner lead 5 bonded at about 200° C. will contract by the cooling. In this case, contrary to the case of the heating, the base film 4 and inner lead 5 will contract more largely than the semiconductor element substrate 1 due to the difference between the thermal expansion coefficient of the base film 4 or inner lead 5 and that of the semiconductor element substrate 1. At this time, because the stud bump 7 and the inner lead 5 have already been bonded to each other, a stress generated due to the difference in thermal expansion coefficient will entirely be applied to the bonding portion between the stud bump 7 and the inner lead 5.

However, the slit-shaped through-hole 9 is formed in the inner lead 5 within the region between the bonding region with the electrode pad 6 or stud bump 7 and the base film 4. Therefore, the stress applied to the bonding portion between the stud bump 7 and inner lead 5 can be released by deformation of the inner lead 5. Therefore, a large force that may result in destruction of the bonding portion is prevented from being applied to the bonding portion.

Next, after the stud bump 7 and the inner lead 5 have been heated and bonded to each other and then cooled down to ordinary temperature, the first encapsulating resin 13 is injected into the device hole 3 to protect the bonding portion between the stud bump 7 and the inner lead 5. At this time, the first encapsulating resin 13 encapsulates the whole of the device hole 3. Moreover, to securely protect the bonding portion between the stud bump 7 and the inner lead 5, the upside of the bonding portion is covered with the second encapsulating resin 14 as shown in FIGS. 1A and 1B.

Thus, it is possible to protect the inner lead 5 and the bonding portion between the inner lead 5 and the electrode pad 6 of the semiconductor element substrate 1 from a recording liquid or the like used for an ink jet recording head by means of the first encapsulating resin 13 and the second encapsulating resin 14. As the first encapsulating resin 13 and the second encapsulating resin 14, it is preferable to select and use a resin comprising an epoxy resin as a major component. In the present invention, the one-can heat-curable epoxy resin NR200C (trade name; manufactured by SANYU REC CO. LTD.) is used as the first encapsulating resin 13 and the one-can heat-curable epoxy resin CV5420D (trade name; manufactured by Matsushita Electric Works, Ltd.) is used as the second encapsulating resin 14. The curing temperature is set to a value equal to or less than the heat-resistant temperature of the nozzle portion 12 formed on the semiconductor element substrate 1 and having the discharging openings for discharging the ink.

Thus, the semiconductor device using the flexible film wiring board is completed. In FIG. 1A, the second encapsulating resin 14 provided at the lower portion is shown to be translucent in order to simplify the explanation.

Moreover, although the present example is described in the case of using the stud bump 7, it is to be understood that the present invention is not limited to the embodiment using the stud bump 7 and includes, for example, use of a plated bump formed by one of various types of plating methods or a bumpless structure in which the inner lead is directly connected to the electrode pad 6.

Moreover, in the present example, because the through-hole 9 is provided without reducing the width of the inner lead 5, the torsional strength is kept as such. Therefore, lowering in bonding strength and connection failure resulting from a positional displacement between the inner lead 5 and the electrode pad 6 or stud bump 7 due to bending or torsion of the inner lead 5 is effectively prevented.

Furthermore, it is possible to determine the width, length and number of the through-holes formed in the inner lead 5 so that the inner lead 5 has a desired rigidity. That is, as the width and length of the through-hole increase, the rigidity of the inner lead 5 decreases. Moreover, when the area of portion(s) of the inner lead 5 occupied by the through-hole(s) is fixed, the rigidity of the inner lead 5 increases as the number of the through-holes increases. Furthermore, the shape of the through-hole 9 is not limited to a rectangular shape and may be a circular shape, ellipsoidal shape, wave-like shape, or the like, depending on the rigidity required for the inner lead 5.

Furthermore, it is not always necessary that the through-hole be a completely penetrated hole but the through-hole may be a recessed groove. Such a recessed portion is an effective configuration when the width of the inner lead 5 cannot be sufficiently secured. That is, because the through-hole 9 is generally formed in the same step as the step of patterning the inner lead 5, and because when an opening width necessary for complete penetration is provided, portions left on both sides of the inner lead 5 are very thin and the strength becomes too small. According to the study by the present inventors, it has been found that when the line width of the portions left on both sides of the inner lead 5 ranges from 15 μm to 30 μm, the stress is most liable to be absorbed, and when the line width is 10 μm or less, the rigidity of the inner lead 5 itself becomes too small and the inner lead 5 will be deformed by its own weight. In such a case, a groove-shaped recess not completely penetrating the inner lead can be formed by setting a photomask pattern used for an etching step to etch to such a width as not to penetrate the inner lead 5.

Figure 2A:
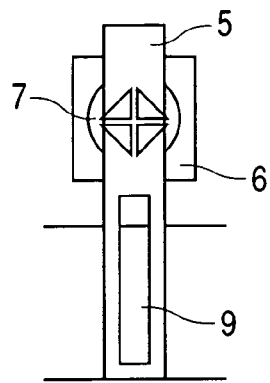
FIGS. 2A, 2B and 2C are plan views of main parts of the semiconductor device of Example 1.
Figure 2B:
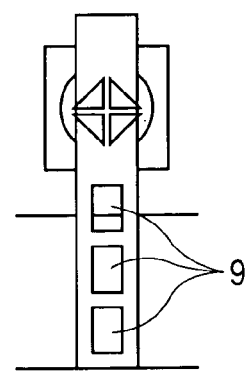
Figure 2C:
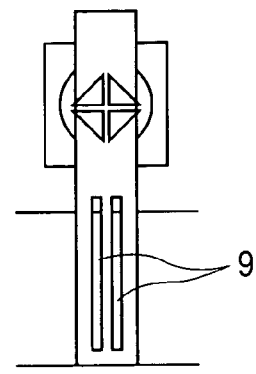

FIGS. 2A to 2C show various shapes of through-holes. FIG. 2A is a plan view showing details of the through-hole 9 formed in the inner lead 5 in FIGS. 1A and 1B. The same reference numerals are employed in FIGS. 2A to 2C as are employed in FIGS. 1A and 1B for equivalent elements and their description is omitted. In FIG. 2A, the through-hole 9 is a rectangular hole formed in the longitudinal direction of the inner lead 5. By using this type of through-hole, it is possible to easily deform the hole in the horizontal direction and the vertical direction in FIG. 2A and release the above stress.

FIG. 2B shows a case in which a plurality of through-holes 9 are arranged in series. The configuration shown in FIG. 2B is effective when the thickness of the inner lead 5 is small. In this case, when a single through-hole 9 is formed, the rigidity of the inner lead 5 becomes too small. Therefore, by forming a plurality of through-holes 9 and forming beams between the through-holes 9, it is possible to secure a necessary rigidity.

Moreover, a configuration of FIG. 2C in which a plurality of through-holes 9 are formed parallel to each other is effective when the width of the inner lead 5 is large. In this case, when a single through-hole 9 is formed in a large width, the rigidity of the inner lead 5 becomes too small. Therefore, by thinly forming a plurality of through-holes 9 and forming beams between them, it is possible to secure a necessary rigidity. The through-holes 9 shown in FIGS. 2A to 2C are not necessarily required to be completely penetrated holes and may be recesses (or grooves).

EXAMPLE 2

Figure 3:
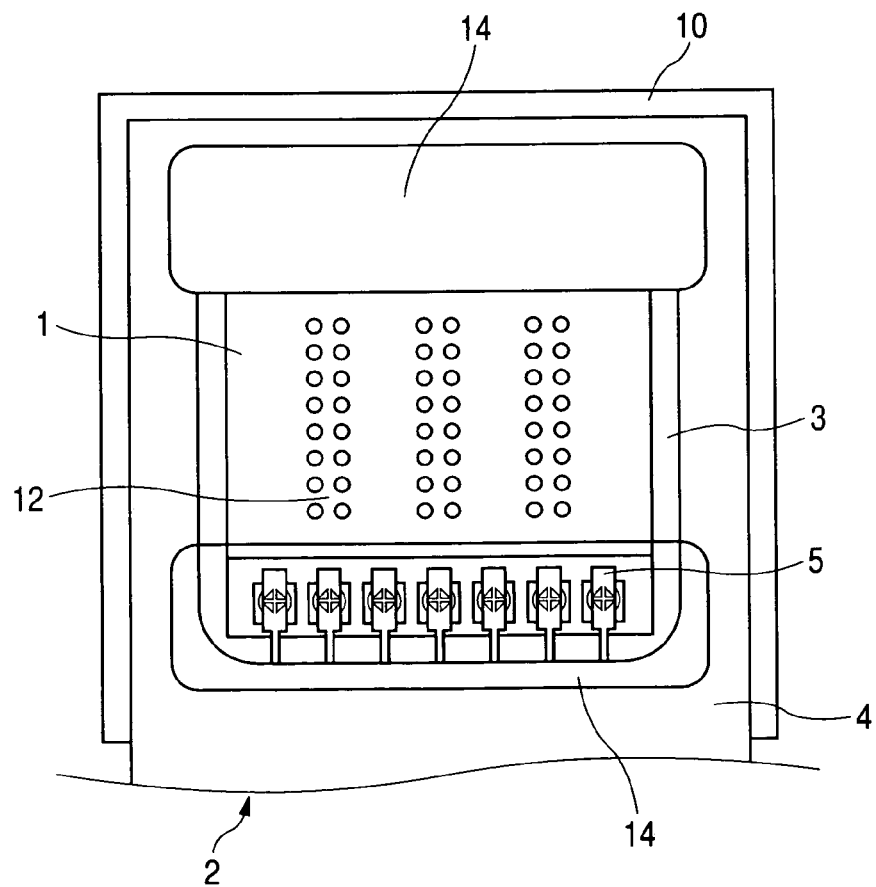
FIG. 3 is a plan view of a semiconductor device of Example 2.

FIG. 3 is a plan view of a main part of a semiconductor device using the flexible film wiring board of Example 2 of the present invention. The same reference numerals are employed in FIG. 3 as are employed in FIG. 1A for equivalent elements and their description is omitted. The embodiment of the present example is effective when the width of the inner lead 5 is too small to form the through-hole 9 in the inner lead 5.

Figure 4A:
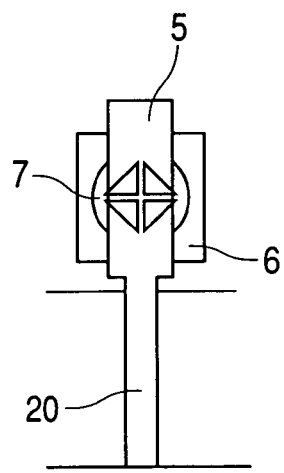
FIGS. 4A, 4B and 4C are plan views of main parts of the semiconductor device of Example 2.
Figure 4B:
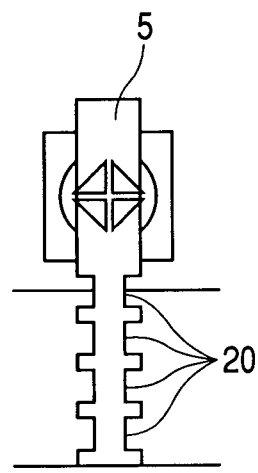
Figure 4C:
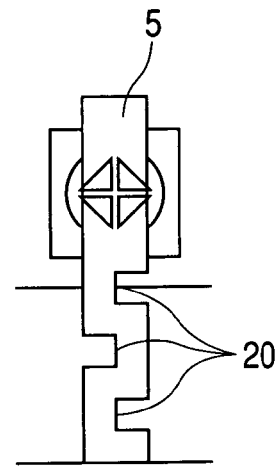

FIGS. 4A, 4B and 4C are plan views showing shapes of the inner lead 5 in the above case. The inner lead 5 shown in FIG. 4A is formed of a rectangular portion to be bonded to the stud bump 7 and a small-lead-width portion 20 having a smaller width than the width of the portion to be bonded to the stud bump 7. The small-lead-width portion 20 is symmetrical about an extension of the widthwise centerline of the portion to be bonded to the stud bump 7.

In FIG. 4B, a plurality of small-lead-width portions 20 of the inner lead 5 are arranged in series and this configuration is effective when the thickness of the inner lead 5 is small. In this case, when a single small-lead-width portion 20 of the inner lead 5 is formed, the rigidity of the inner lead 5 becomes too small. Therefore, by forming a plurality of small-lead-width portions 20 of the inner lead 5 and forming wide-width reinforcement portions between them, a necessary rigidity is secured. At this time, the number, length and the like of the small-lead-width portions 20 may be determined each time such that a desired rigidity is obtained.

In FIG. 4C, a plurality of small-lead-width portions 20 of the inner lead 5 are arranged staggeringly (or in a staggered state) and this is a configuration effective when the width of the inner lead 5 is comparatively small. In this case, when the small-lead-width portion 20 of the inner lead 5 is formed from both sides in the horizontal direction of FIG. 4C, the rigidity of the inner lead 5 becomes too small. Therefore, by staggeringly forming a plurality of small-lead-width portions 20 from only one side in the horizontal direction in the figure alternately, a necessary rigidity is secured. Also for this configuration, the number, length and the like of the small-lead-width portions 20 may be determined each time so that a desired rigidity is obtained.

EXAMPLE 3

Figure 5:
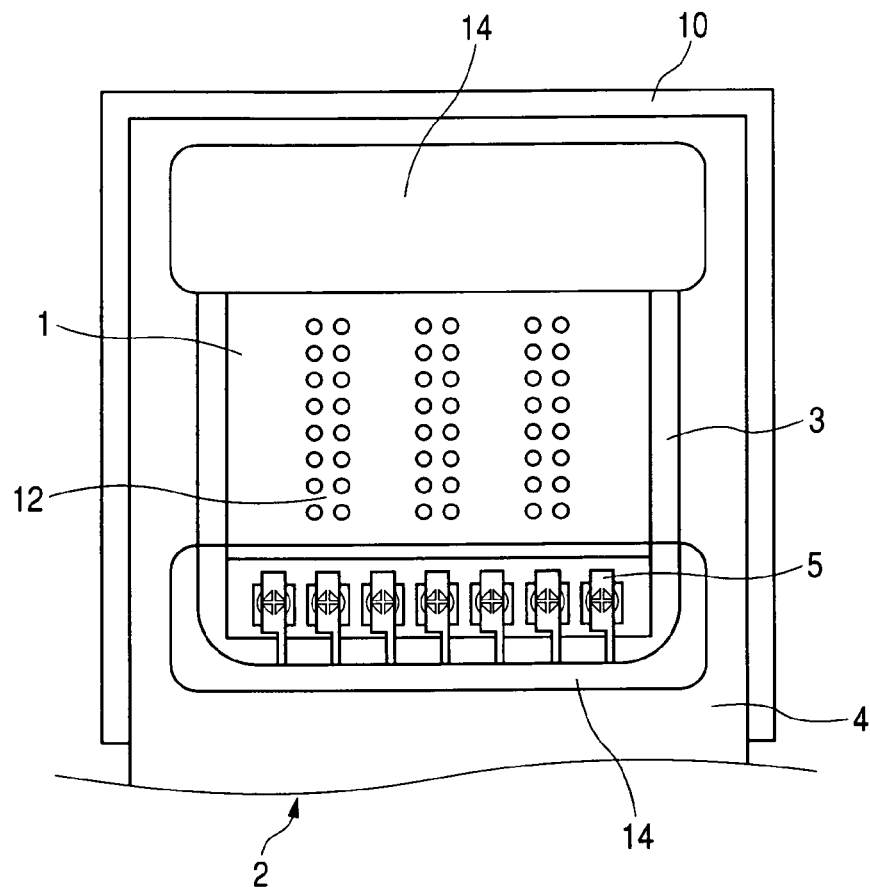
FIG. 5 is a plan view of a semiconductor device of Example 3.

FIG. 5 is a plan view of a main part of a semiconductor device using a flexible film wiring board of Example 3 of the present invention. The same reference numerals are employed in FIG. 5 as are employed in FIG. 1A for equivalent elements and their description is omitted. The configuration of the present example is effective when the width of the inner lead 5 is so small that the through-hole 9 cannot be formed in the inner lead 5.

Figure 6A:
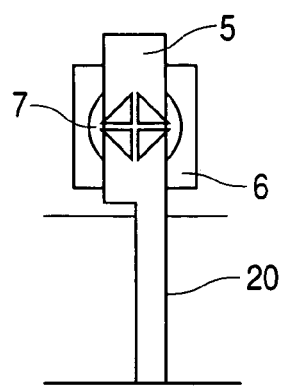
FIGS. 6A and 6B are plan views of main parts of the semiconductor device of Example 3.
Figure 6B:
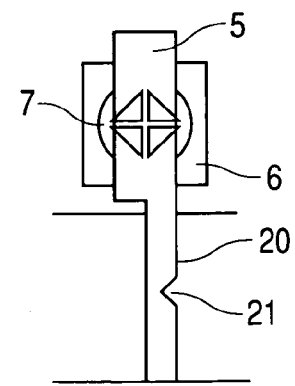
Figure 7A:
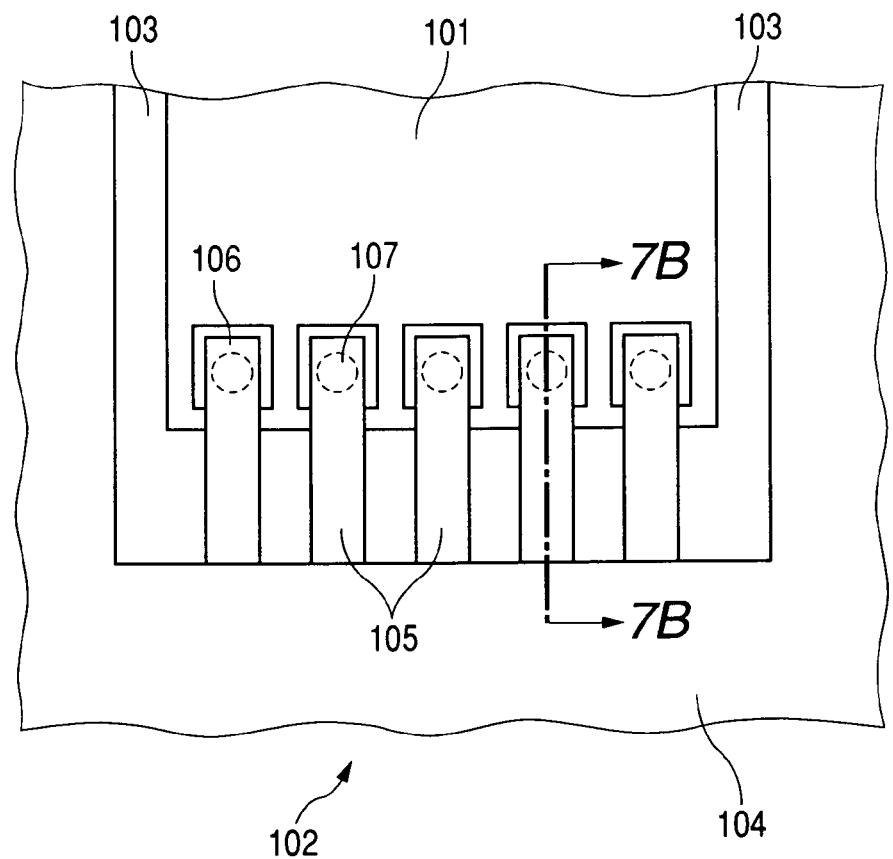
FIG. 7A is a plan view of a main part of a conventional semiconductor device and FIG. 7B is a sectional view taken along line 7B—7B in FIG. 7A.
Figure 7B:
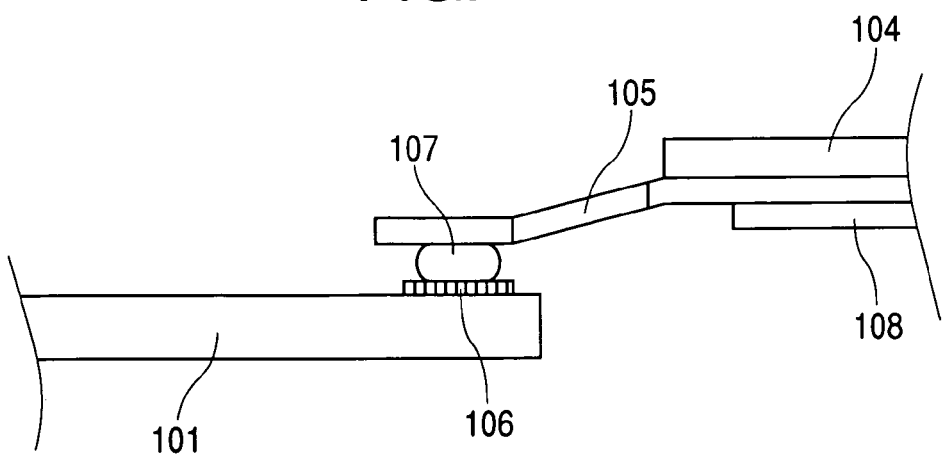
Figure 8:
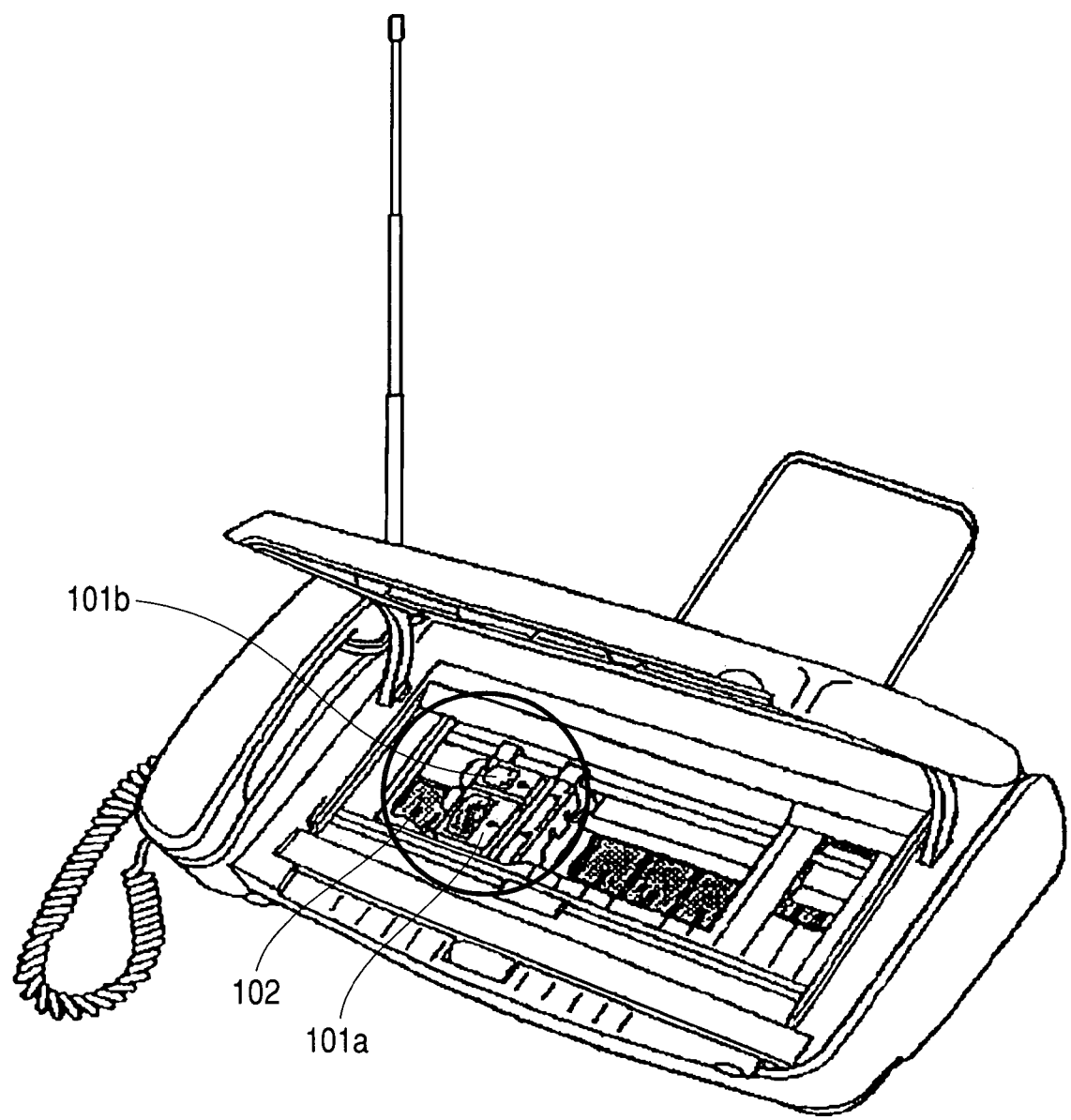
FIG. 8 is a perspective view of a printing machine using a flexible film wiring board.
Figure 9:
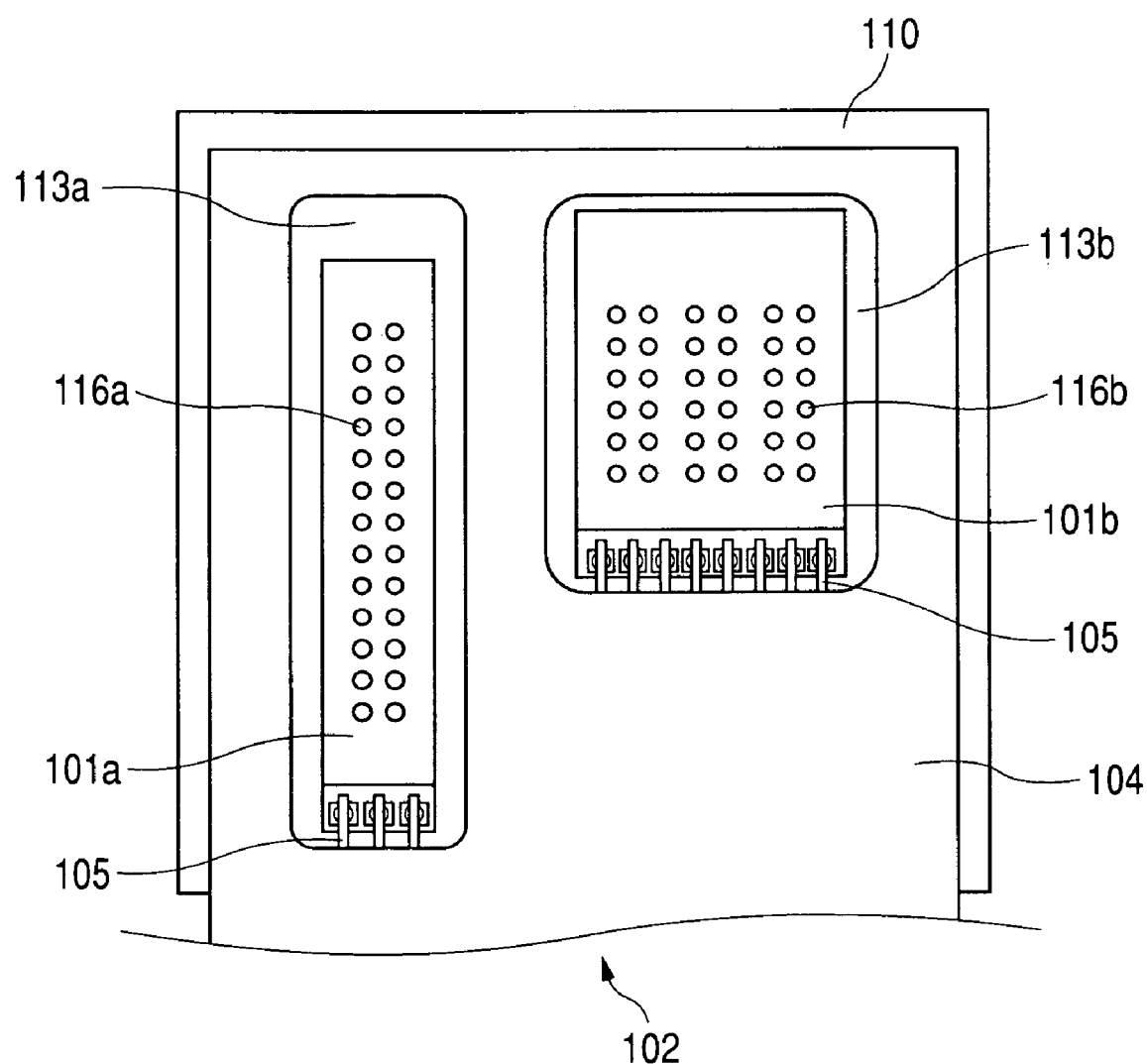
FIG. 9 is a plan view of a conventional semiconductor device using an ink jet system.

FIGS. 6A and 6B are plan views showing shapes of the inner lead 5 in the above case. The inner lead 5 shown in FIG. 6A is formed of a rectangular portion to be bonded to the stud bump 7 and a small-lead-width portion 20 having a smaller width than the width of the portion to be bonded to the stud bump 7, as is the case with the inner lead 5 shown in FIG. 4A. The shape shown in FIG. 6A is different from the shape shown in FIG. 4A in that the widthwise centerline of the small-lead-width portion 20 is offset with respect to the widthwise centerline of the inner lead 5 in the bonding region by a desired amount. By using the above configuration, the stress absorption effect of the inner lead in the vertical direction in FIG. 6A can be particularly demonstrated.

In FIG. 6B, a cutout portion 21 having a desired shape is formed in the region of the small-lead-width portion 20 of the inner lead 5. Thereby, the stress absorption effect of the inner lead 5 in the vertical direction can be further demonstrated. The number of cutout portions to be formed is not limited to 1 and a desired number of cutout portions may be formed according to necessity.

Thus, the inner lead 5 of the present invention includes one or more through-holes 9 penetrating the inner lead 5, recessed grooves, or small-lead-width portions 20 from the region near the rear of the bonding portion with the stud bump 7 to the region near the end at the opening side of device hole 3. The inner lead 5 thus formed makes it possible to moderate a stress of the bonding portion generated due to a difference in thermal expansion coefficient by an elastic deformation of the inner lead 5. Moreover, by increasing the width of the inner lead 5 at the bonding portion to the electrode pad 6 of the semiconductor element substrate 1 or the stud bump 7 formed on the electrode pad 6, it is possible to sufficiently secure an alignment margin.

When fabricating the through-hole 9, groove-shaped recessed portion 9 and/or small-lead-width portion 20 of the present invention in the same fabrication steps as the steps of fabricating the inner lead 5 and the wiring pattern of the flexible film wiring board 1 at the same time, the number of fabrication steps is not increased, which is preferable from the viewpoint of cost reduction.

Incidentally, although the flexible film wiring board of the present invention has been described with respect to an inner lead of TAB, it should be understood that the flexible film wiring board of the present invention may be applied to a flying lead of FPC.

With the semiconductor device of the present invention, by provision of a small sectional-area region having a sectional area less than the sectional areas of other portions within a region from the vicinity of the rear of the electrode pad bonding region of an inner lead to the vicinity of the opening end of a device hole, it is possible to make a part of an inner lead exhibit a stress absorbing function while securing the bonding area of an electrode pad bonding portion and moderate a stress applied to the bonding portion because of elastic deformation of the inner lead mainly in the small sectional-area region during application of the stress to the inner lead.

With the semiconductor device of the present invention, by forming a small sectional-area region of a through-hole penetrating the inner lead or a recessed groove, the slit portion serves as a stress absorbing portion and the inner lead is elastically deformed, so that it is possible to moderate a stress applied to the bonding portion.

With the semiconductor device of the present invention, by making the width of the inner lead in the small sectional-area region less than the width of the inner lead in the bonding portion, the small-width portion serves as a stress absorbing portion and the inner lead is elastically deformed, whereby it is possible to moderate a stress applied to the bonding portion.

This application claims priority from Japanese Patent Application Nos. 2003-313735 filed Sep. 5, 2003 and 2004-230803 filed Aug. 6, 2004, both of which are hereby incorporated by reference herein.

What is claimed is:

1. A semiconductor device comprising:
   a support member;
   a flexible film wiring board fixed to the support member, having at least one device hole formed therein and having a plurality of inner leads provided therein and extended therefrom; and
   at least one semiconductor element substrate with a plurality of electrode pads fixed to the support member, housed in the device hole and mounted by bonding the plurality of extended inner leads to the plurality of electrode pads within the device hole,
   wherein each of the inner leads is bonded to a corresponding one of the electrode pads of the semiconductor element substrate, and each of the inner leads has a small sectional-area portion that has a sectional area smaller than a sectional area of another portion of the inner lead, the small sectional-area portion being arranged in a region between (i) a portion at which the inner lead is bonded to the corresponding electrode pad and (ii) the flexible film wiring board, and being for releasing a stress applied to the bonding portion between the electrode pad and the inner lead.

2. The semiconductor device according to claim 1, wherein the small sectional-area portion is constituted by at least one through-hole penetrating the inner lead.

3. The semiconductor device according to claim 1, wherein the small sectional-area portion is constituted by at least one recessed groove portion formed in the inner lead.

4. The semiconductor device according to claim 1, wherein the width of the inner lead at the small sectional-area portion is less than the width of the inner lead at the bonding portion.

5. The semiconductor device according to claim 4, wherein the widthwise centerline of the small sectional-area portion is offset with respect to the widthwise centerline of the inner lead at the bonding portion.

6. The semiconductor device according to claim 5, wherein the small sectional-area portion has a cutout portion formed therein.

7. A semiconductor device comprising:

a support member;

a flexible film wiring board fixed to the support member, having at least one device hole formed therein;

a plurality of inner leads extended from the flexible film wiring board and provided in the device hole; and at least one semiconductor element substrate with a plurality of electrode pads fixed to the support member, housed in the device hole and connected by bonding the plurality of extended inner leads to the plurality of electrode pads within the device hole, wherein each of the inner leads is bonded to a corresponding one of the electrode pads of the semiconductor element substrate, and each of the inner leads has a small sectional-area portion that has a sectional area smaller than a sectional area of another portion of the inner lead, the small sectional-area portion being arranged in a region between (i) a portion at which the inner lead is bonded to the corresponding electrode pad and (ii) the flexible film wiring board.

* * * * *